US006575800B1

(12) United States Patent
Kobayashi et al.

(10) Patent No.: US 6,575,800 B1
(45) Date of Patent: Jun. 10, 2003

(54) ELECTROLUMINESCENT ELEMENT AND METHOD OF PRODUCING THE SAME

(75) Inventors: Hidekazu Kobayashi, Nagano-ken (JP); Hiroshi Kiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/297,500

(22) PCT Filed: Aug. 19, 1998

(86) PCT No.: PCT/JP98/03675
§ 371 (c)(1),
(2), (4) Date: Jul. 6, 1999

(87) PCT Pub. No.: WO99/12396
PCT Pub. Date: Mar. 11, 1999

(30) Foreign Application Priority Data

Sep. 1, 1997 (JP) .............................. 9-236326

(51) Int. Cl.⁷ .............................. H01J 9/00; H01J 9/24
(52) U.S. Cl. .................... 445/24; 313/498; 313/504; 428/690; 427/532
(58) Field of Search .................. 313/498, 502, 313/503, 504, 506; 428/690; 445/24, 46, 50, 59; 427/532, 533, 536, 537

(56) References Cited

U.S. PATENT DOCUMENTS

| 5,320,913 | A | * | 6/1994 | Morimoto et al. ........... 428/688 |
| 5,429,884 | A | * | 7/1995 | Namiki et al. .............. 428/690 |
| 5,540,999 | A | * | 7/1996 | Yamamoto et al. ........ 428/411.1 |
| 5,747,183 | A | * | 5/1998 | Shi et al. .................... 428/690 |
| 5,895,692 | A | | 4/1999 | Shirasaki et al. ........... 427/557 |
| 5,967,872 | A | * | 10/1999 | Betsui et al. ................. 445/24 |
| 6,040,108 | A | * | 3/2000 | Schadeli et al. ............. 430/200 |
| 6,113,448 | A | * | 9/2000 | Kobayashi et al. ........... 445/24 |

FOREIGN PATENT DOCUMENTS

| JP | 63-264692 | 11/1988 | ........... C09K/11/00 |
| JP | 2-261889 | 10/1990 | ........... C09K/11/06 |
| JP | 3-114197 | 5/1991 | ........... H05B/33/14 |
| JP | 4-73886 | 3/1992 | ........... H05B/33/04 |
| JP | 5-258859 | 10/1993 | ........... H05B/33/12 |
| JP | 5-258862 | 10/1993 | ........... H05B/33/14 |
| JP | 6-215874 | 8/1994 | |
| JP | 7-65958 | 3/1995 | ........... H05B/33/22 |
| JP | 7-235378 | 9/1995 | ........... H05B/33/10 |
| JP | 8-321381 | 12/1996 | ........... H05B/33/14 |

* cited by examiner

Primary Examiner—Vip Patel
Assistant Examiner—Kevin Quarterman
(74) Attorney, Agent, or Firm—Hogan & Hartson, LLP

(57) ABSTRACT

An electroluminescent element and method for manufacturing the same including an anode, a cathode, and a light emitting layer disposed in a plane between the anode and the cathode. The light emitting layer containing a fluorescent first compound, and at least a portion of the light emitting layer also containing a second compound which absorbs a first fluorescence generated by the first compound and emits a second fluorescence of a longer wavelength than the first fluorescence. The concentration of the second compound has a gradient along a thickness direction of the light emitting layer perpendicular to the plane.

8 Claims, 5 Drawing Sheets

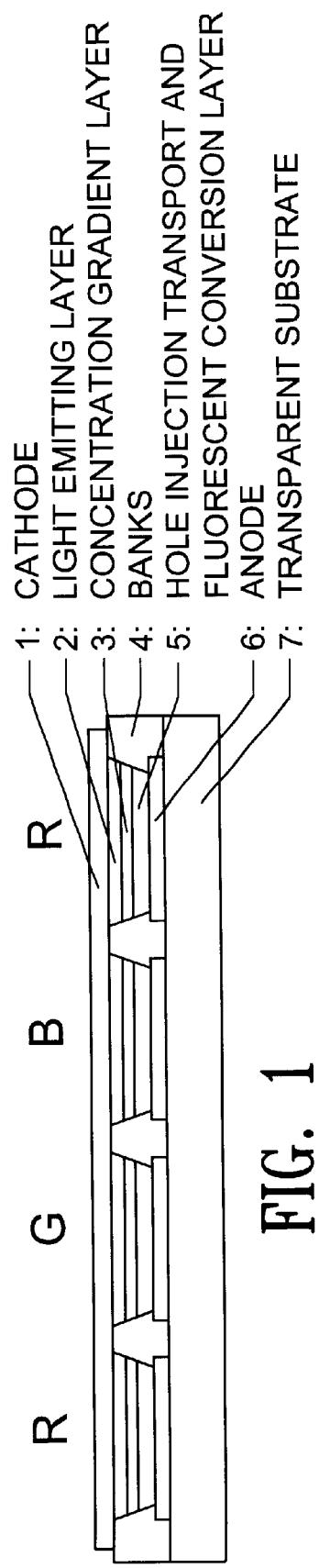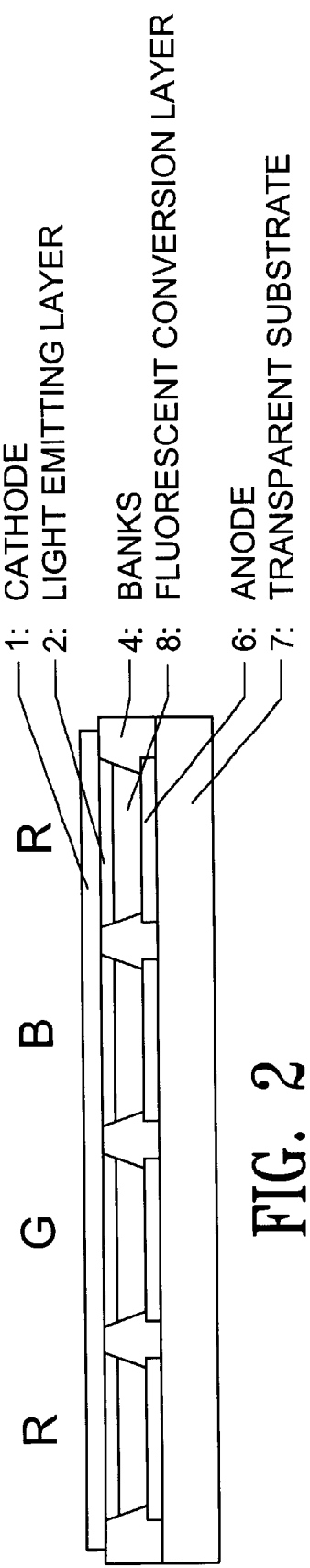

ELECTROLUMINESCENT ELEMENT AND METHOD OF PRODUCING THE SAME

BACKGROUND OF THE INVENTION

1. Field of the Invention

The present invention relates to the construction of electroluminescent elements in which light-emitting thin films are used which can be employed, for example, as displays for lap-top computers, televisions and mobile communications, and a method for their manufacture.

2. Description of the Related Art

Light-emitting elements in which the electroluminescence of organic compounds is employed are auto-luminescent and so they have a high visibility, since they are completely solid elements they have excellent impact resistance and since they are also characterized by a low drive voltage they are clearly useful as light emitting elements for various types of display equipment.

Clearly multi-color elements like those seen in Braun tubes (CRT) and liquid crystal displays (LCD) will be required to extend the range of application of the above-mentioned organic EL elements as display elements.

The following methods, for example, were known as means of producing multi-color display apparatus using EL elements in the past. (1) Methods in which EL materials which emit light of the three colors red (R), green (G) and blue (B) are arranged in a matrix (Japanese Laid-open Patent Publications Sho.57-157487, Sho.58-145989 and H3-214593 for example). (2) Methods in which the three primary colors RGB are realized by combining color filters with EL elements which emit white light (Japanese Laid-open Patent Publications H1-315988, H2-273496, H3-194895 for example). (3) Methods in which EL elements which emit blue light and fluorescent conversion elements are combined for conversion to provide the three primary colors RGB (Japanese Laid-open Patent Publication H3-152897).

However, the methods described under (1) above must have three types of light emitting material arranged in a very finely divided manner in a matrix and so the technology is complex and the product cannot be manufactured cheaply, and since the life expectancies of the three types of light emitting material will generally be quite different there is a further disadvantage in that there will inevitably be a displacement of the color balance with the passage of time. Furthermore, the methods described in (2) make use of some of the light output from EL elements which emit white light using color filters and so there is a disadvantage in that the utilization efficiency of the EL light, which is to say the conversion efficiency, is low. For example, the white EL light simply comprises the three primary colors RGB which are of equal intensity and if the colors are obtained from this using color filters then at the most only a 33% conversion efficiency can be obtained. In practice, when the emission spectrum and visual perception are taken into consideration then only a much lower conversion efficiency can be obtained. On the other hand, if the three primary colors RGB could be obtained with conversion efficiencies of more than 33% respectively with the methods described under (3) these would be better methods than those described under (2) above.

Thus, methods in which fluorescent conversion films are arranged in the lamination direction over the EL elements, thus changing the EL emission color, are known (Japanese Laid-open Patent Publications Sho.63-18139, H3-152897). Since blue is emitted by the organic EL elements, the conversion efficiency can be 100%. Furthermore, an 80% conversion efficiency can be achieved using coumarin 153 as disclosed in Japanese Laid-open Patent Publication H3-152897 for green. Furthermore, a method of converting EL element blue light to red with a conversion efficiency of more than 33% has been disclosed in Japanese Laid-open Patent Publications H8-286033.

Thus, the fluorescent conversion method is superior as a means of achieving a full color display, but in terms of the actual method of manufacture, processes similar to the those for the color filters which are used conventionally in color liquid crystal display apparatus are required to manufacture a fluorescent conversion film and there is a problem in that this is very expensive.

SUMMARY OF THE INVENTION

The present invention is intended to overcome these weaknesses in the conventional technology. An object of the present invention is to provide electroluminescent elements with which the emitted light of a blue light emitting organic EL element can be converted to other colors with a high conversion efficiency of at least 33% and to provide a method of manufacture whereby these color electroluminescent elements can be manufactured cheaply using an ink-jet method.

The electroluminescent elements of this invention are characterized in that they comprise a light emitting layer comprised of a fluorescent first compound with is arranged in a plane between a cathode and an anode. A hole injection transport layer comprising a mixture of a second compound which absorbs the fluorescence generated by the aforementioned first compound and emits a longer wavelength than the aforementioned fluorescence. A compound which has a charge injection/transportation capacity is arranged between the aforementioned anode and the aforementioned light emitting layer. By this means, the second compound layer is arranged on the light output side and so all of the light emitted from the light emitting layer which is formed by the first compound falls on the second compound layer, is absorbed by the second compound and discharged after being wavelength converted, and so the color purity is high.

If, in this case, the construction is such that the concentration of the aforementioned second compound has a gradient along a thickness direction of the light emitting layer perpendicular to the plane and the aforementioned hole injection transport layer then movement of the holes is facilitated and the light emission efficiency is improved.

Furthermore, another electroluminescent element of the invention is characterized in that it is comprises a light emitting layer having a mixture of a fluorescent first compound and a second compound which absorbs the fluorescence emitted by the aforementioned first compound and emits fluorescence of longer wavelength that the aforementioned fluorescence which is a arranged between an anode and a cathode, and in that it is established in such a way that the concentration of the aforementioned second compound with respect to the aforementioned first compound in the aforementioned light emitting layer varies with a gradient along the thickness direction of said light emitting layer. Moreover, such elements are characterized in that the proportions of the aforementioned first compound and the aforementioned second compound are from 99.9:0.1 to 90:10. With such constructions, the charge injected from the electrodes reaches the light emitting layer with good efficiency and so the light emitting layer comprising mainly the first compound emits the fluorescence of the first compound and then this fluorescence and the fluorescence which has been reflected by the cathode is absorbed directly and indirectly with good efficiency by the second compound and the second compound emits its own fluorescence. In this case there is no distinct interface between the first compound and the second compound and so direct energy transfer occurs at the same time as the energy transfer by means of light and the conversion efficiency is improved.

Furthermore, another such element is characterized in that a charge injection transport layer is formed between the aforementioned light emitting layer and the electrodes in the aforementioned electroluminescent element. With this construction charge injection in the aforementioned construction is achieved with greater efficiency with the result that the light emitting efficiency is also improved.

These elements are also characterized in that the first and second compounds used in the abovementioned electroluminescent elements are organic compounds or organometallic compounds. The drive voltage can be greatly reduced in this way.

These elements are also characterized in that the surface of the abovementioned electroluminescent element is subjected to an anti-glare treatment and/or anti-reflection treatment. The reflected light from the surface of the electroluminescent element can be reduced or scattered in this way and so the display becomes easier to see.

Moreover, these elements are characterized in that they are provided with a means whereby the layer structure of the electroluminescent element itself is isolated from the surroundings. Each layer is protected by this means and the durability is improved.

Next, the method for the manufacture of electroluminescent elements where a light emitting layer is sandwiched between an anode and a cathode is characterized in that it is provided with a process whereby a transparent anode is formed on a transparent substrate, a process whereby a hole injection transport layer is formed using a mixture of compound which has a charge injection/transportation function with a second compound which absorbs the fluorescence produced by a fluorescent first compound and emits fluorescence of a longer wavelength than said fluorescence, a process whereby said first compound is deposited as a film on the whole of the surface of the aforementioned hole injection transport layer using a solvent of which the compatibilities in respect of the aforementioned first compound and the aforementioned second compound are controlled and in which said second compound in the aforementioned hole injection transport layer permeates into said first compound layer and a light emitting layer is formed, and a process whereby a cathode is formed on said light emitting layer. With this method the hole injection transport layer can be patterned and so it is possible to avoid short circuiting between the anode and cathode even if substances which have good charge injection properties which have a high electrical conductivity are used for the hole implanting material. Furthermore, the fluorescent conversion substance can also be patterned at the same time and so full color and high efficiency electroluminescent elements can be manufactured using the best materials with a simple process.

Next, there is a method for the manufacture of electroluminescent elements in which a light emitting layer is disposed in a plane between an anode and a cathode. The method for manufacture include; a process whereby a transparent anode is formed on a transparent substrate, a process whereby a film of the first fluorescent compound is formed over the whole surface, a process whereby a second compound is applied as a solution and absorbs the fluorescence emitted by a fluorescent first compound and emits fluorescence of a longer wavelength than said fluorescence, said second compound is caused to permeate into the aforementioned first compound and a light emitting layer is formed having a gradient along a thickness direction of the light emitting layer perpendicular to the plane, and a process whereby a cathode is formed on the aforementioned light emitting layer.

Furthermore, there is a method of manufacture which provides; a process whereby a transparent anode is formed on a transparent substrate, a process whereby a second compound is applied as a solution and absorbs the fluorescence emitted by a fluorescent first compound and emits fluorescence of a longer wavelength than said fluorescence, a process whereby the aforementioned first compound is formed as a film over the whole surface using a solvent of which the compatibilities with respect to the aforementioned first compound and the aforementioned second compound are controlled and said second compound permeates into said first compound and a light emitting layer is formed, and a process whereby a cathode is formed on the aforementioned light emitting layer. By means of these methods of manufacture it is possible to easily achieve changes in the emission color of adjoining picture elements and to reduce the manufacturing costs. Furthermore, in those cases where the first compound is discharged from an ink-jet head, the concentration gradient in the thickness direction can be controlled by controlling the compatibility with the second compound. It is possible by this means to manufacture electroluminescent elements in which the gradient is matched to the characteristics of the first compound and the second compound.

Next, there is a method for the manufacture of electroluminescent elements in which a light emitting layer is sandwiched between an anode and a cathode in which there are provided a process whereby a transparent anode is formed on a transparent substrate, a process whereby a light emitting film is formed by mixing a fluorescent first compound and a second compound which absorbs the fluorescence emitted by said first compound and emits fluorescence of a longer wavelength than said fluorescence and the mixture is applied as a solution, and a process in which a cathode is formed on the aforementioned light emitting layer. With this method it is possible to manufacture full color electroluminescent elements with a very simple process and very cheaply.

Next, there is a method for the manufacture of electroluminescent elements in which a light emitting layer is sandwiched between an anode and a cathode in which there are provided a process whereby a transparent anode is formed on a transparent substrate, a process whereby a light emitting film is formed by attaching a fluorescent first compound as a solution, and a process whereby a cathode is formed on the aforementioned light emitting layer. With this method it is possible to manufacture full color electroluminescent elements with a very simple process and very cheaply.

A process whereby a hole injection transport layer is formed between the anode and the light emitting layer may be provided in the electroluminescent elements as a means of resolving the problems described above. It is possible to manufacture bright elements in which charge implantation is achieved efficiently by forming a hole injection transport later.

There is a method of manufacture in which the application of the abovementioned solution in an electroluminescent element is carried out by discharging said solutions onto the surface to which they are to be attached using an ink-jet system as a means of resolving the problems described above. With an ink-jet system, fluid compounds can be introduced selectively into each picture element without wasting material.

There is a method wherein banks are formed between picture elements in order to divide the aforementioned picture elements. In this way it is possible to prevent cross-contamination between adjacent picture elements when forming a film with the ink-jet method and to prevent diffusion of the organic molecules between adjacent picture elements after the elements have been produced. Furthermore, there is no crossing of the emission colors between picture elements and brilliant light emission can be achieved.

BRIEF DESCRIPTION OF THE DRAWINGS

FIG. 1 is a simple cross sectional view of the electroluminescent elements of Embodiment 1 of the invention;

FIG. 2 is a simple cross sectional view of the electroluminescent elements of Embodiment 2 of the invention;

DESCRIPTION OF THE PREFERRED EMBODIMENTS

Embodiment 1

Figure 3:
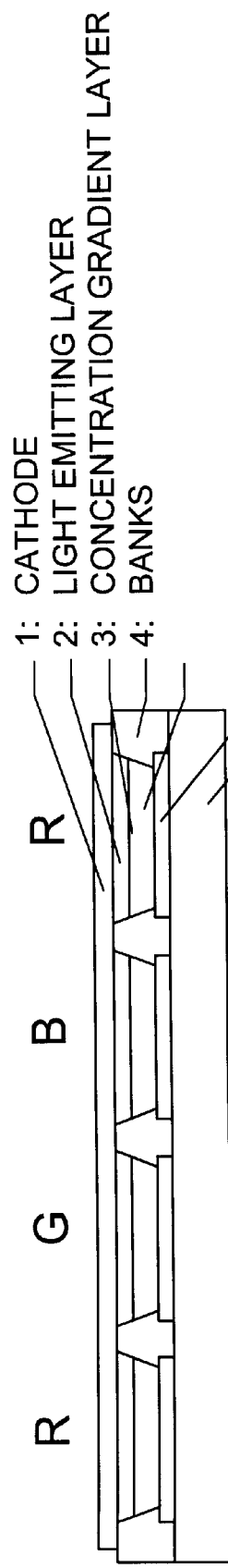
FIG. 3 is a simple cross sectional view of the electroluminescent elements of Embodiment 3 of the invention.

This embodiment shows and example of an electroluminescent element comprising a transparent substrate, a transparent anode or anode array, a hole injection transport layer comprising the second compound and a compound which has a hole injection transport function, a light emitting layer comprising the first compound and a cathode or cathode array, and the second compound concentration has a gradient between the hole injection transport layer and the light emitting layer.

A simple cross sectional drawing of the electroluminescent element of this embodiment is shown in FIG. 1. As shown in FIG. 1, the electroluminescent element of this embodiment is furnished with a transparent substrate 7, an anode 6, a hole injection transport and fluorescent conversion layer 5, banks 4, a concentration gradient layer 3, a light emitting layer 2 and a cathode 1. The anode 6 is an anode array which had been formed by patterning for each of the picture elements on the transparent substrate 7. The hole injection transport and fluorescent conversion layer 5 is a layer which has been formed by mixing a second compound which absorbs the fluorescence emitted by the first compound from which the light emitting layer is formed and emits fluorescence of a longer wavelength (fluorescent conversion layer) and a compound which has a charge injection/transportation capacity. The banks 4 are constructed as partitions to divide the picture elements. The light emitting layer 2 is comprised of the aforementioned fluorescent first compound. The cathode 1 has a construction which can be used as a common cathode.

An electroluminescent element which has been made in this way has emitted light of the color corresponding to the fluorescence of the second compound, and when coumarin 6 is used for the second compound the light emitting efficiency is 1.2 lm/W and the maximum brightness is 13,000 cd/m$^2$. The electroluminescent element has the same efficiency as in the case of the vapor deposition method indicated below.

The same effect can be realized even if active elements such as TFT elements are formed to form the anode and large capacity displays are possible.

An electron injection transport layer may be formed between the light emitting layer and the cathode in this embodiment, and metal organic complexes such as aluminum quinolinium complexes, for example, and oxadiazole complexes, for example, can be used.

The same effect can be realized even if active elements such as TFT elements are formed to form the anode and large capacity displays are possible.

The method by which the abovementioned electroluminescent element was manufactured is described below. In the method by which the electroluminescent element which had a light emitting layer sandwiched between an anode and a cathode was manufactured, the transparent anode or anode array was formed on the transparent substrate. Next, the hole injection transport layer was formed by discharging a suitable solution by means of an ink-jet head onto the picture elements on the anode or anode array. The solution is a mixture of the second compound and the compound which has a charge injection transport capacity. The aforementioned light emitting layer was generated by forming the first compound into a film over the whole surface using a solvent in which the compatibility of the second compound is controlled and causing the second compound to permeate into the first compound layer. Finally, the cathode or cathode array was formed over the top.

First of all, ITO was EB vapor deposited, vapor deposited or sputtered as a transparent electrode onto a clean glass substrate (transparent substrate 7) and the anode 6 was formed by patterning. Moreover, the banks 4 were formed as shown in FIG. 1 using a photosensitive polyimide. Next, after subjecting the surface of the substrate to treatment with ultraviolet radiation of wavelength 174 nm, a solution comprised of a mixture of the hole injection transport substance and the second compound was discharged onto the anode surface using an ink-jet head and dried forming the hole injection transport and fluorescent conversion layer 5 of thickness 50 nm. The first compound which formed the light emitting layer was printed in the form of a solution with a roll-coater onto the hole injection transport layer and dried to form the light emitting layer 2 of thickness 50 nm. As a result of this process, a concentration gradient layer 3 was formed between the hole injection transport and fluorescent conversion layer 5 and the light emitting layer 2. Next, an Mg:Ag (10:1) alloy was EB vapor deposited, vapor deposited or sputtered on using a mask to form the cathode 1. Finally, the element was molded under an inert gas in a degassed epoxy resin as a means of isolating the element from the surroundings. Other thermoset resins, ultraviolet setting resins or polysiloxane containing silicon resins, for example, can be used in the same way provided that they are able to keep out air and moisture and do not invade the organic films.

TPD (Chemical Formula 1) was used for the hole injection material, but m-MTDATA (Chemical Formula 2), porphin compounds such as copper phthalocyanine, NPD (Chemical Formula 3), TAD (Chemical Formula 4), polyvinylcarbazole and derivatives of these compounds, for example, can be used in the same way provided that they have a charge injection capacity. Also, these compounds may have a laminated structure. Perylene was used for the second compound red wavelength conversion and coumarin 6 was used for the green wavelength conversion. Moreover, DCM1 (Chemical Formula 5), quinacridone derivatives, rubulene, DCJT (Chemical Formula 6) and Nile Red, for example, can be used for the second compound.

(Chemical Formula 1) TPD

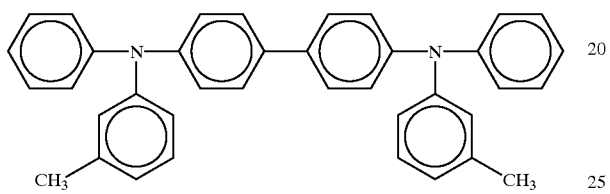

(Chemical Formula 2) m-MTDATA

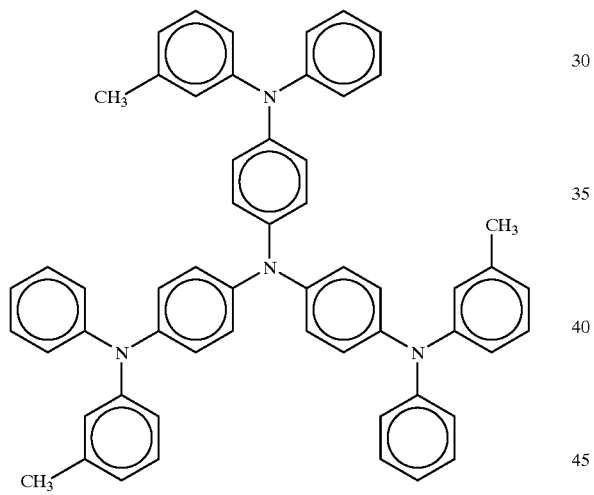

(Chemical Formula 3) NPD

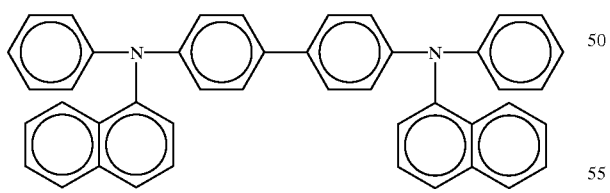

(Chemical Formula 4) TAD

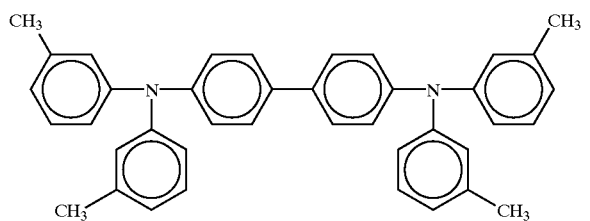

-continued (Chemical Formula 5) DCM1

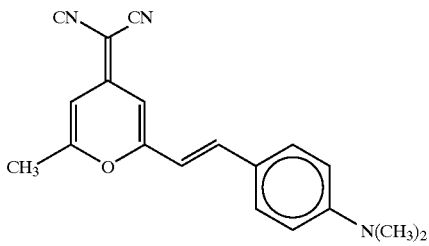

(Chemical Formula 6) DCJT

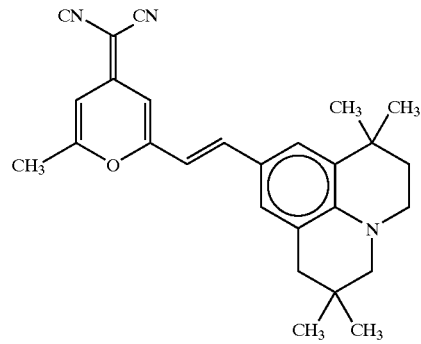

DPVBi (Chemical Formula 7) was used for the first compound, but 1,1,4,4-tetraphenylbutadiene, oxadiazole derivatives, azomethine zinc complex, Balq (Chemical Formula 8), polyvinylcarbazole and derivatives of these compounds can be used provided that they have a similar effect.

(Chemical Formula 7) DPVBi

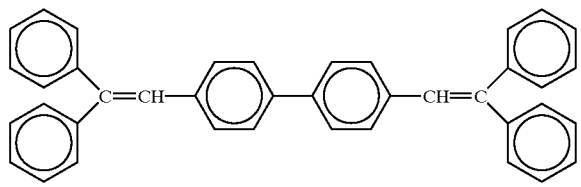

(Chemical Formula 8) BAlq

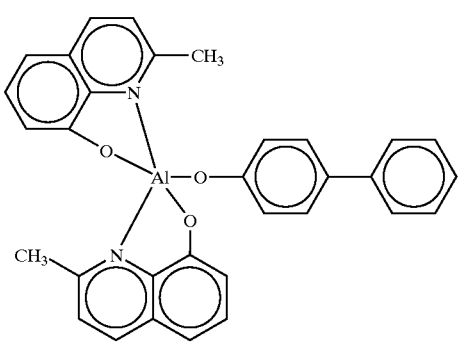

Screen printing methods, spin coating methods where a film is formed with a solution, and methods where the second compound is diffused into the light emitting layer, for example, can be used instead of the method described here for forming the light emitting layer.

The same effects can be realized even if active elements such as TFT elements are formed for forming the anode and high capacity displays are possible.

Materials which have a low work function can be used instead of Mg:Ag for forming the cathode and, for example, magnesium, aluminum, and alkali and alkaline earth metals such as lithium and calcium, and alloys in which these metals are used, can be used for this purpose.

Embodiment 2

In this embodiment there is no concentration gradient of the second compound between the light emitting layer and the hole injection transport layer in the structure of embodiment 1.

A simple cross sectional drawing of the electroluminescent element of this embodiment is show in FIG. 2. As shown in FIG. 2, the electroluminescent element of this embodiment is furnished with a transparent substrate 7, an anode 6, a fluorescent conversion layer 8, the banks 4, a light emitting layer 2 and a cathode 1. The electroluminescent element of embodiment 2 differs from embodiment 1 in that there is no concentration gradient layer 3. This is because the first compound is attached by vapor deposition instead of by coating the first compound in the form of a solution.

An electroluminescent element which has been made in this way has emitted light of the color corresponding to the fluorescence of the second compound, and when coumarin 6 is used for the second compound the light emitting efficiency is 1.2 lm/W and the maximum brightness is 13,000 $cd/m^2$, and it has roughly the same efficiency as when the light emitting layer was formed by printing as in the first embodiment.

An electron injection transport layer may be formed between the light emitting layer and the cathode in this embodiment using, for example, metal organic complexes such as aluminum quinolinium complexes, and oxadiazole complexes.

The same effects can be realized even if active elements such as TFT elements are formed for forming the anode and high capacity displays are possible.

The method by which the abovementioned electroluminescent element was manufactured is described below. First of all, ITO was EB vapor deposited, vapor deposited or sputtered as a transparent electrode onto a clean glass substrate (transparent substrate 7) and the anode 6 was formed by patterning. Moreover, the banks 4 were formed as shown in FIG. 2 using a photosensitive polyimide. Next, after subjecting the surface of the substrate to treatment with ultraviolet radiation of wavelength 174 nm, a solution comprising a mixture of the hole injection transport substance and the second compound was discharged onto the anode surface using an ink-jet head and dried forming the fluorescent conversion layer 8 having a thickness of 50 nm. The first compound which formed the light emitting layer 2 was vapor deposited using the vacuum vapor deposition method to a film thickness of 50 nm on the hole injection transport and wavelength converting layer 8. Next, an Mg:Ag (10:1) alloy was EB vapor deposited, vapor deposited or sputtered on to form the cathode 1. Next, the electroluminescent element was molded in epoxy resin.

Embodiment 3

This embodiment shows an example of an electroluminescent element comprising a transparent substrate, a transparent anode or anode array, a light emitting layer, and a cathode or cathode array, and the aforementioned light emitting layer comprises a mixture of the first compound and the second compound and, moreover, the concentration of the second compound with respect to the first compound has a gradient in the thickness direction of the aforementioned light emitting layer.

A simple cross sectional drawing of the electroluminescent element of this embodiment is show in FIG. 3. As shown in FIG. 3, the electroluminescent element of this embodiment is furnished with a transparent substrate 7, an anode 6, the banks 4, a concentration gradient layer 3, a light emitting layer 2 and a cathode 1. It differs from embodiment 1 in that there is no hole injection/transporting and fluorescent conversion layer.

An electroluminescent element which has been made in this way has emitted light of the color corresponding to the fluorescence of the second compound, and when coumarin 6 is used for the second compound the light emitting efficiency was 0.1 lm/W and the maximum brightness was 150 $cd/m^2$.

An electron injection transport layer may be formed between the light emitting layer and the cathode in this embodiment using, for example, metal organic complexes such as aluminum quinolinium complexes, and oxadiazole complexes.

The same effect can be realized even if active elements such as TFT elements are formed to form the anode and large capacity displays are possible.

The method by which the abovementioned electroluminescent element was manufactured is described below. This embodiment shows an example of an electroluminescent element in which the aforementioned light emitting layer comprises a mixture of the first compound and a second compound which absorbs the fluorescence which is emitted by the aforementioned first compound and emits fluorescence of a longer wavelength that the aforementioned fluorescence, and the concentration of the second compound with respect to the first compound in the aforementioned light emitting layer has a gradient in the thickness direction of the aforementioned light emitting layer.

First of all, ITO was EB vapor deposited, vapor deposited or sputtered as a transparent electrode onto a clean glass substrate (transparent substrate 7) and the anode 6 was formed by patterning. The banks 4 were formed as shown in FIG. 3 using a photosensitive polyimide. Next, after subjecting the surface of the substrate to treatment with ultraviolet radiation of wavelength 174 nm, a film of the second compound was formed on the electrode surface by discharging the compound in the form of a solution within the banks using the ink-jet method and the film was dried. Next, the first compound was discharged in the form of a solution with an ink-jet head, using a solvent which was compatible with the second compound, and dried forming the light emitting layer 2 of thickness 50 nm. As a result of this process the second compound was mixed with the first compound to form the concentration gradient layer 3. Next, an Mg:Ag (10:1) alloy was EB vapor deposited, vapor deposited or sputtered on to form the cathode 1. Finally, the electroluminescent element was molded under an inert gas in a degassed epoxy resin as a means of isolating the element for the surroundings.

The mixing ratio of the first and second compounds (proportional to the film thickness with the same concentration) is preferably within the range from 99.9:0.1 to 90:10. The light emitting efficiency is markedly reduced outside this range.

Perylene was used for the red long wavelength conversion material and coumarin 6 was used for the green long wavelength conversion material as second compound, but DCM1, quinacridone, rubulene, DCJT, Nile Red and derivatives of these compounds can be used for second compound. Polyvinylcarbazole was used for the first compound, but DPVBi, 1,1,4,4-tetraphenylbutadiene, oxadiazole, azomethine zinc complex, Balq and derivatives of these compounds can be used provided that they have a similar effect.

The first compound can be applied using a printing method rather than by being formed into a film using the ink-jet method.

The same effects can be realized even if active elements such as TFT elements are formed for forming the anode and high capacity displays are possible.

Materials which have a low work function can be used instead of Mg:Ag for forming the cathode and, for example, magnesium, aluminum, and alkali and alkaline earth metals such as lithium and calcium, and alloys in which these metals are used, can be used for this purpose.

Embodiment 4

Figure 4:
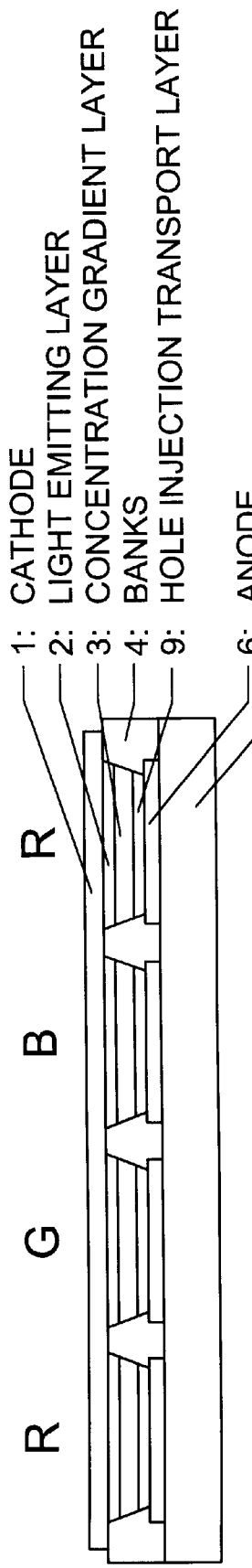
FIG. 4 is a simple cross sectional view of the electroluminescent elements of Embodiment 4 of the invention.

This embodiment is an example where a hole injection transport layer is formed in Embodiment 3. A simple cross sectional drawing showing the structure of this embodiment is shown in FIG. 4. As shown in FIG. 4, the electroluminescent element of this embodiment is furnished with a transparent substrate 7, an anode 6, a hole injection transport layer 9, banks 4, a concentration gradient layer 3, a light emitting layer 2 and a cathode 1. It differs from embodiment 3 in that a hole injection transport layer 9 is included.

An electroluminescent element which has been made in this way has emitted light of the color corresponding to the fluorescence of the second compound, and when coumarin 6 was used for the second compound the light emitting efficiency was 0.4 lm/W and the maximum brightness was 300 $cd/m^2$.

An electron injection transport layer may be formed between the light emitting layer and the cathode in this embodiment, metal organic complexes such as aluminum quinolinium complexes, for example, and oxadiazole complexes, for example, can be used.

The same effect can be realized even if active elements such as TFT elements are formed to form the anode and large capacity displays are possible.

The method by which the abovementioned electroluminescent element was manufactured is described below. First of all, ITO and EB vapor deposited, vapor deposited or sputtered as a transparent electrode onto a clean glass substrate (transparent substrate 7) and the anode 6 was formed by patterning. The banks 4 were formed as shown in FIG. 4 using a photosensitive polyimide. Next, after subjecting the surface of the substrate to treatment with ultraviolet radiation of wavelength 174 nm, a thin film of the NPD of thickness 50 nm was vapor deposited on the anode surface for the hole injection transport layer 9. Subsequently, films of the second compound and of the first compound were produced using the same procedures as in embodiment 3 (concentration gradient layer 3, light emitting layer 2). Then an Mg:Ag (10:1) alloy was EB vapor deposited, vapor deposited or sputtered on to form the cathode 1, and the electroluminescent unit was molded in epoxy resin.

Embodiment 5

This embodiment is an example of an electroluminescent element comprising a transparent substrate, a transparent anode or anode array, a hole injection transport layer, a first compound layer, a second compound layer, and a cathode or cathode array. The second compound has a concentration gradient between the first compound layer and the second compound layer.

Figure 5:
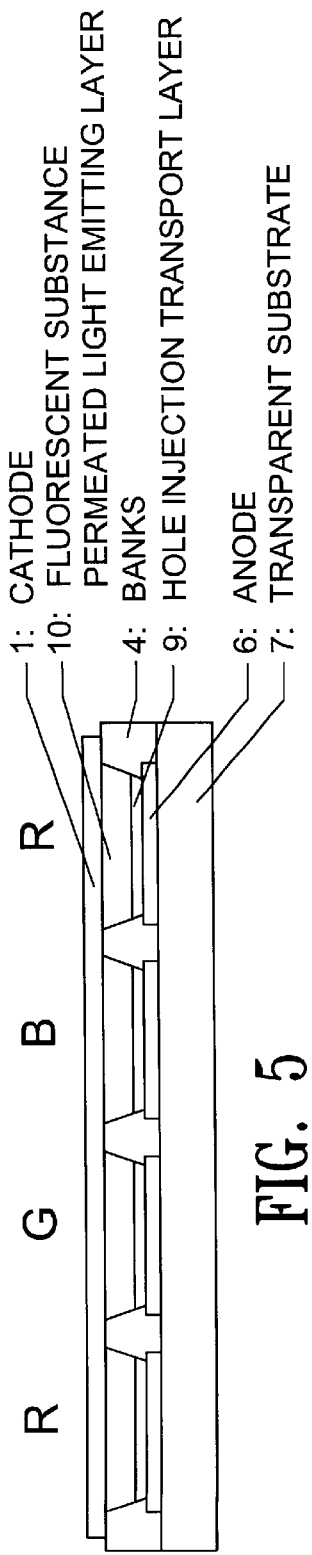
FIG. 5 is a simple cross sectional view of the electroluminescent elements of Embodiment 5 of the invention.

A simple cross sectional drawing of the electroluminescent element of this embodiment is show in FIG. 5. As shown in FIG. 5, the electroluminescent element of this embodiment is furnished with a transparent substrate 7, an anode 6, a hole injection transport layer 9, the banks 4, a fluorescent material impregnated light emitting layer 10 and a cathode 1. It differs for embodiment 4 in that a fluorescent material is impregnated into the light emitting layer.

An electroluminescent element which has been made in this way has emitted light of the color corresponding to the fluorescence of the second compound. When coumarin 6 was used for the second compound the light emitting efficiency was 0.2 lm/W and the maximum brightness was 200 $cd/m^2$.

An electron injection transport layer may be formed between the light emitting layer and the cathode in this embodiment, metal organic complexes such as aluminum quinolinium complexes, for example, and oxadiazole complexes, for example, can be used.

The same effect can be realized even if active elements such as TFT elements are formed to form the anode, and large capacity displays are possible.

The method by which the abovementioned electroluminescent element was manufactured is described below. This embodiment shows an example of an electroluminescent element in which the light emitting layer is sandwiched between the electrodes or electrode arrays, and in this case a transparent anode or anode array is formed on a transparent substrate, and then a hole injection transport layer may be formed, and then the aforementioned first compound is formed as a film over the whole surface and then the aforementioned second compound is discharged from an ink-jet head as an appropriate solution over the aforementioned anode or anode array and the second compound is caused to permeate into the first compound layer to form the aforementioned light emitting layer, and then the cathode or cathode array is formed over the top.

First of all, ITO was EB vapor deposited, vapor deposited or sputtered as a transparent electrode onto a clean glass substrate (transparent substrate 7) and the anode 6 was formed by patterning. The banks 4 were formed as shown in FIG. 5 using a photosensitive polyimide. Next, after subjecting the surface of the substrate to treatment with ultraviolet radiation of wavelength 174 nm, a 1:1 mixture of copper phthalocyanine and epoxypropyltriethoxysilane was coated on the surface of the electrode for the hole injection transport layer 9 and baked at 200° C. to form a layer of thickness 50 nm. Next, a film of the first compound was printed in the form of a solution for the light emitting layer and dried to provide a film thickness of 40 nm. Next, a film was formed within the banks with the ink-jet method using the second compound in the form of a solution. The second compound permeated the first compound and dried to form the fluorescent substance impregnated light emitting layer 10. Next, an Mg:Ag (10:1) alloy was EB vapor deposited, vapor deposited or sputtered on to form the cathode 1. Finally, the electroluminescent element was molded in an inert gas with a degassed epoxy resin.

The mixing ratio of the first and second compounds (proportional to the film thickness with the same concentration) is preferably within the range from 99.9:0.1 to 90:10. The light emitting efficiency is markedly reduced outside this range.

Perylene was used as the second compound for the red wavelength conversion material and coumarin 6 was used for the green wavelength conversion material, but DCM1, quinacridone, rubulene, DCJT, Nile Red and derivatives of these compounds can be used for the second compound.

Polyvinylcarbazole was used for the first compound, but DPVBi, 1,1,4,4-tetraphenylbutadiene, oxadiazole, azomethine zinc complex, Balq and derivatives of these compounds can be used provided that they have a similar effect.

The same effects can be realized even if active elements such as TFT elements are formed for forming the anode and high capacity displays are possible.

Materials which have a low work function can be used instead of Mg:Ag for forming the cathode and, for example, magnesium, aluminum, and alkali and alkaline earth metals such as lithium and calcium, and alloys in which these metals are used, can be used for this purpose.

Embodiment 6

This embodiment is an example of an electroluminescent element comprising a transparent substrate, a transparent anode or anode array, a hole injection transport layer, a mixed first compound and second compound layer, and a cathode or cathode array.

Figure 6:
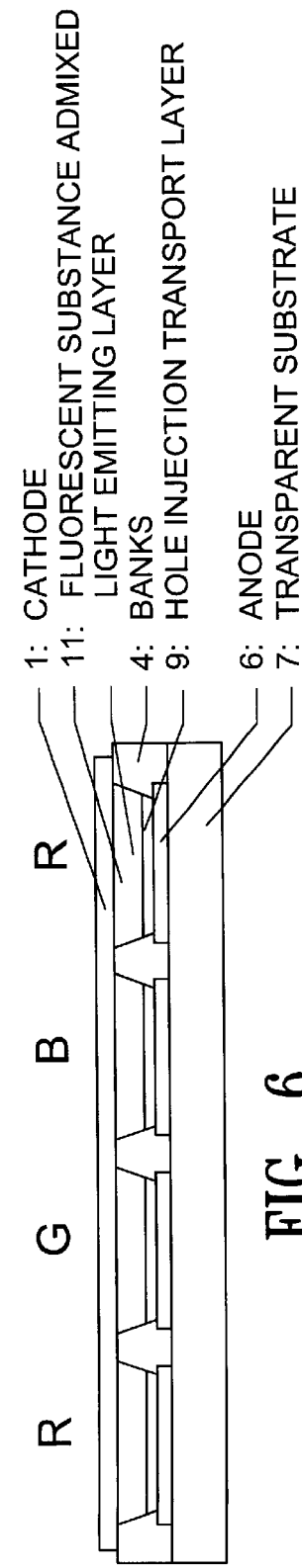
FIG. 6 is a simple cross sectional view of the electroluminescent elements of Embodiment 6 of the invention.

A simple cross sectional drawing of the electroluminescent element of this embodiment is shown in FIG. 6. As shown in FIG. 6, the electroluminescent element of this embodiment is furnished with a transparent substrate 7, an anode 6, a hole injection transport layer 9, the banks 4, a fluorescent material admixed light emitting layer 11 and a cathode 1. It differs for embodiment 4 in that a fluorescent material is admixed in the light emitting layer.

An electroluminescent element which has been made in this way has emitted light of the color corresponding to the fluorescence of the second compound, and when coumarin 6 was used for the second compound the light emitting efficiency was 0.08 lm /W and the maximum brightness was 150 cd/m$^2$.

An electron injection transport layer may be formed between the light emitting layer and the cathode in this embodiment using, for example, metal organic complexes such as aluminum quinolinium complexes, and oxadiazole complexes.

The same effect can be realized even if active elements such as TFT elements are formed to form the anode, and large capacity displays are possible.

The method by which the abovementioned electroluminescent element was manufactured is described below. This embodiment shows an example of an electroluminescent element in which the light emitting layer is sandwiched between opposed electrodes or electrode arrays, and in this case a transparent anode or anode array is formed on a transparent substrate, then a hole injection transport layer may be formed, and then the aforementioned first compound and the aforementioned second compound are mixed and discharged in the form of an appropriate solution with an ink-jet head over the anode or anode array to form the aforementioned light emitting layer, and then the cathode or cathode array is formed over the top.

First of all, ITO was EB vapor deposited, vapor deposited or sputtered as a transparent electrode onto a clean glass substrate (transparent substrate 7) and the anode 6 was formed by patterning. The banks 4 were formed as shown in FIG. 6 using a photosensitive polyimide. Next, after subjecting the surface of the substrate to treatment with ultraviolet radiation of wavelength 174 nm, a 1:1 mixture of copper phthalocyanine and epoxypropyltriethoxysilane was coated on the surface of the electrode for the hole injection transport layer 9 and this was baked at 200° C. to form a layer of thickness 50 nm. Then, the first compound was printed in the form of a solution and dried to a film thickness of 40 nm as the light emitting layer. Next, a 99:1 mixture of the first compound and the second compound was formed into a film within the banks as a solution using the ink-jet method and dried. A light emitting layer 11 in which a fluorescent material was admixed was formed in this way. Next, an Mg:Ag (10:1) alloy was EB vapor deposited, vapor deposited or sputtered on to form the cathode 1. The electroluminescent element was molded under an inert gas in a degassed epoxy resin as a means of isolating it from the surroundings.

The mixing ratio of the first and second compounds (proportional to the film thickness with the same concentration) is preferably within the range from 99.9:0.1 to 90:10. The light emitting efficiency is markedly reduced outside this range.

Perylene was used as the second compound for the red wavelength conversion material and coumarin 6 was used for the green wavelength conversion material, but DCM1, quinacridone, rubulene, DCJT, Nile Red and derivatives of these compounds can be used for the second compound.

Polyvinylcarbozole was used for the first compound, but DPVBi, 1,1,4,4-tetraphenylbutadiene, oxadiazole, azomethine zinc complex, BAlq and derivatives of these compounds can be used provided that they have a similar effect.

The same effects can be realized even if active elements such as TFT elements are formed for forming the anode and high capacity displays are possible.

Materials which have a low work function can be used instead of Mg:Ag for forming the cathode and, for example, magnesium, aluminum, and alkali and alkaline earth metals such as lithium and calcium, and alloys in which these metals are used, can be used for this purpose.

Embodiment 7

This embodiment is an example of a method for the manufacture of an electroluminescent element which has a light emitting layer sandwiched between opposed electrodes or electrode arrays in which a transparent anode or anode array is formed on a transparent substrate, a hole injection transport layer may be formed, and then the aforementioned light emitting layer is formed by discharging as an appropriate solution with an ink-jet head a first compound on the anode or anode array and then forming a cathode or cathode array over the top.

Figure 7:
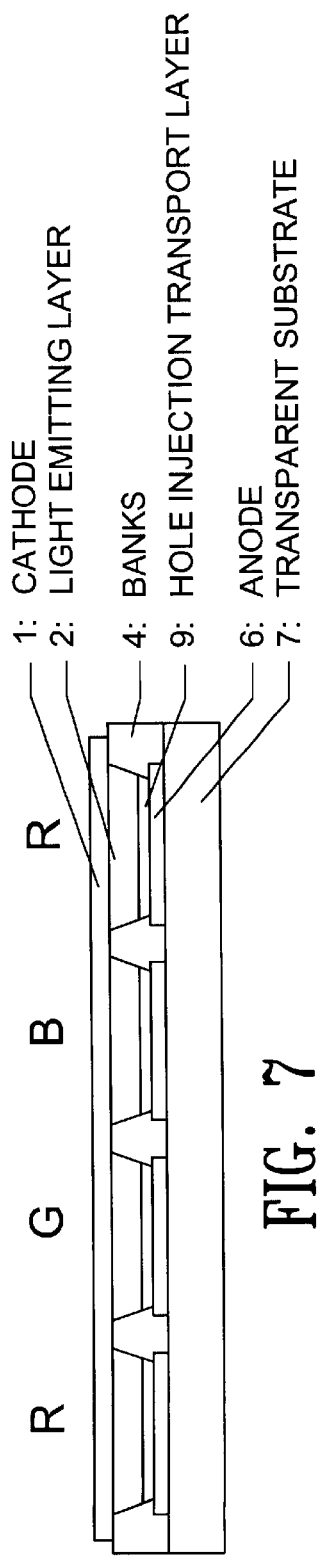
FIG. 7 is a simple cross sectional view of the electroluminescent element of Embodiment 7 of the invention.

A simple cross sectional drawing of an electroluminescent element of this embodiment is shown in FIG. 7. As shown in FIG. 7, the electroluminescent element of this embodiment is furnished with a transparent substrate 7, an anode 6, a hole injection transport layer 9, the banks 4, a light emitting layer 2 and a cathode 1. It differs from the abovementioned embodiment in that a fluorescent first compound is used for the light emitting layer.

The method of manufacture of an electroluminescent element is described below. First of all, ITO was EB vapor deposited, vapor deposited or sputtered as a transparent electrode onto a clean glass substrate (transparent substrate 7) and the anode 6 was formed by patterning. The banks 4 were formed as shown in FIG. 6 using a photosensitive polyimide. Next, after subjecting the surface of the substrate to treatment with ultraviolet radiation of wavelength 174 nm, a 1:1 mixture of copper phthalocyanine and epoxypropyltriethoxysilane was coated on the surface of the electrode for the hole injection transport layer 9 and this was baked at 200° C. to form a layer of thickness 50 nm. Next, the first compound was printed in the form of a solution and dried to a film thickness of 40 nm as the light emitting layer 2. More of the first compound was then formed into a film by being discharged within the banks in the form of a solution using the ink-jet method and dried. Next, an Mg:Ag (10:1) alloy was EB vapor deposited, vapor deposited or sputtered on to form the cathode 1. Finally, the electroluminescent element was molded under an inert gas in a degassed epoxy resin as a means of isolating it from the surroundings.

Polyvinylcarbazole was used for the first compound in the blue light emitting picture elements, but DPVBi, 1,1,4,4-tetraphenylbutadiene, oxadiazole, azomethine zinc complex, BAlq and derivatives of these compounds can be used. Furthermore, a mixture with Alq3 (Chemical Formula 9) as a dopant can be used in a green light emitting picture element and coumarin 6, for example, can be admixed as a dopant for a blue-green light emitting substance. Furthermore, poly(2-methoxy-5-(2'-ethylhexyloxy)-1,4-phenylenevinylene) can be admixed as a dopant in a red light emitting picture element. SCM1 and Nile Red, for example, can be admixed as dopants in a blue-green light emitting picture element.

(Chemical Formula 9) Alq3

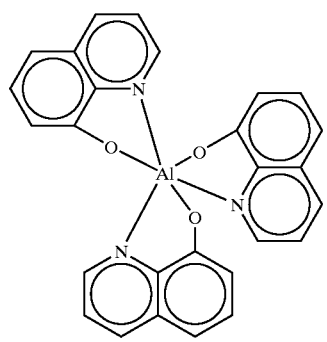

The same effects can be realized even if active elements such as TFT elements are formed for forming the anode and high capacity displays are possible.

Materials which have a low work function can be used instead of Mg:Ag for forming the cathode and, for example, magnesium, aluminum, and alkali and alkaline earth metals such as lithium and calcium, and alloys in which these metals are used, can be used for this purpose.

Embodiment 8

This embodiment is an example in which the surfaces of the electroluminescent elements made in embodiment 1 to 7 are subjected to an anti-glare treatment and/or an anti-refection treatment.

On sticking a "Non-glare Sheet AG20" manufactured by the Nitto Denko Co. onto the transparent substrates shown in the embodiments, reflections were greatly reduced and visibility was improved. Furthermore, on applying an anti-reflection coat to the Non-glare sheet the reflections were virtually eliminated and visibility was improved.

Provided that they has a similar effect, all anti-glare sheets can be used in the same way. Furthermore, multi-layer coatings which has layers which have different refractive indices, and coating with materials which have a low refractive index, and especially with fluorinated polymers such as "Saitoppu" (manufactured by the Asahi Glass Co.) for example, can also be used as anti-reflection coats.

Embodiment 9

Figure 8:
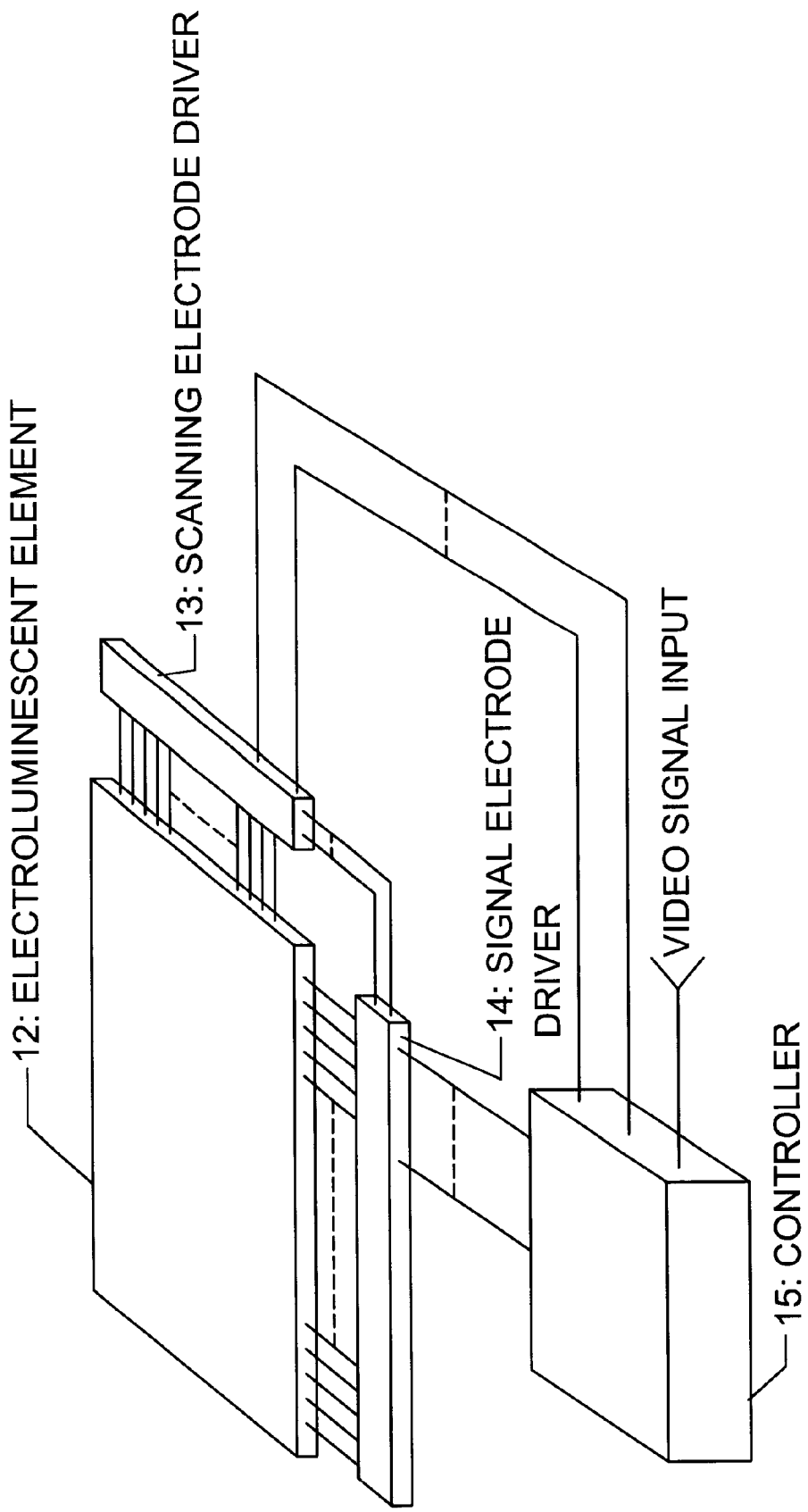
FIG. 8 is a perspective view of the drive circuit of the electroluminescent element of Embodiment 9 of the invention.

An example in which an electroluminescent element of the invention is provided with a simple matrix drive is shown in this embodiment. A simple connection chart for the drive circuit and the electroluminescent element is shown in FIG. 8. As shown in FIG. 8, said display apparatus includes; the electroluminescent element 12, a scanning electrode driver 13, a signal electrode driver 14 and a controller 15. The electroluminescent element 12 is an element as manufactured in any of the abovementioned embodiments. The anode and cathode are formed as a rectangular array of anodes and cathodes, which are connected in the way indicated in FIG. 8. The scanning electrode driver 13 is the driver which specifies the drive element in the vertical direction of the screen. The signal electrode driver 14 is the driver which specifies the drive element in the horizontal direction of the screen. The controller 15 controls the overall picture element drive by supplying scanning electrode signals and signal electrode signals to the aforementioned drivers.

Figure 9:
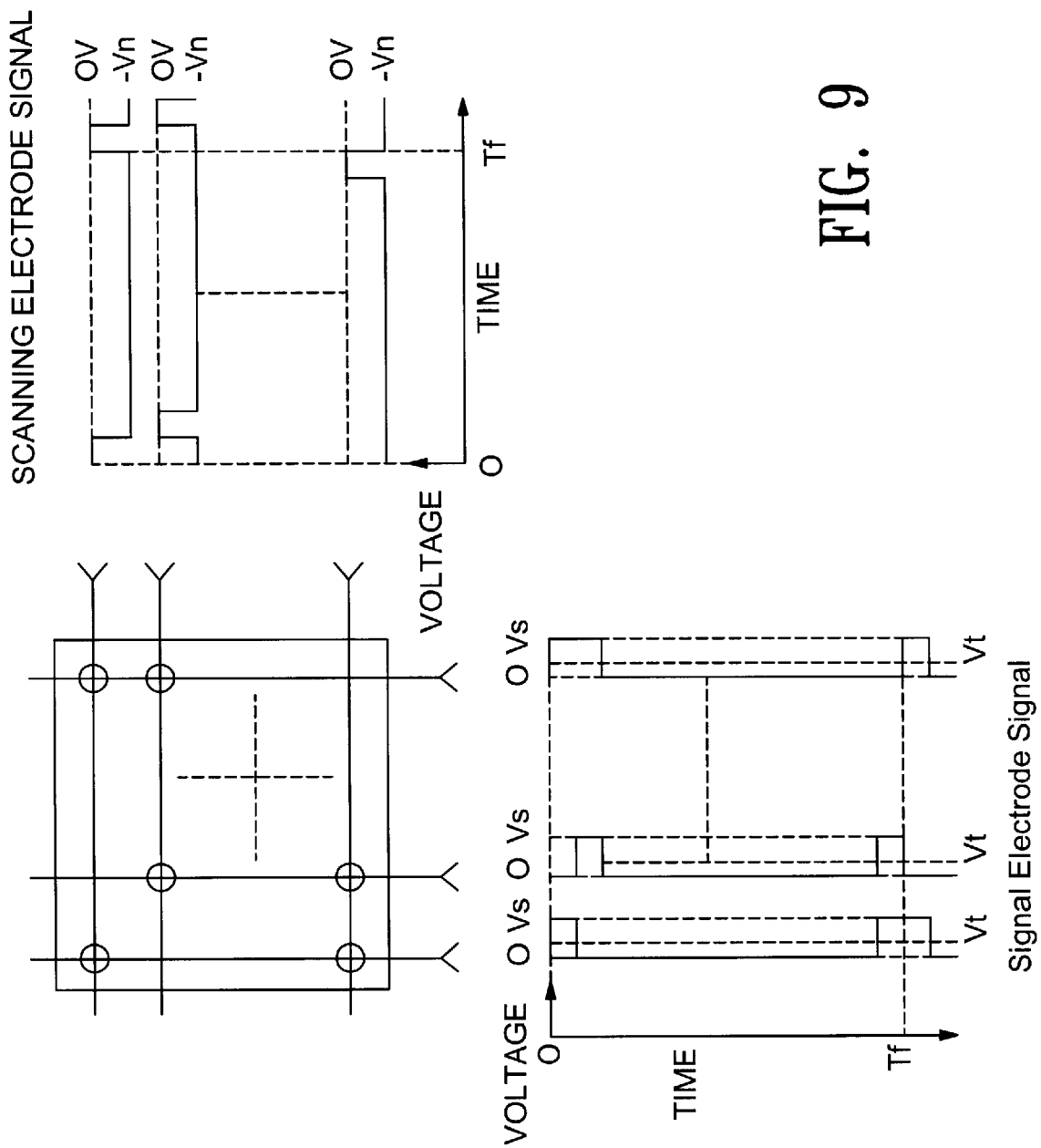
FIG. 9 is a drawing of the drive waveform used when driving the electroluminescent element of Embodiment 9 of the invention.

The drive waveform which the controller 15 applies to the anode and the cathode is shown in FIG. 9. In FIG. 9, Tf shows the time for one scan. Here it is being driven at 1/100 duty. With this drive waveform a waveform with a pulse width which matches the steps to be displayed is applied to the selected picture element at an adequate voltage Vs for it to emit light. When an electroluminescent element of Embodiment 1 is being used a brightness of 100 cd/m$^2$ was obtained at a drive voltage of 20 V when coumarin 6 was being used for the second compound.

With the abovementioned invention it is possible to realize electroluminescent elements which are bright and which have high contrast by means of a very simple construction with an electroluminescent element in which a light emitting element and fluorescent conversion materials are combined. Furthermore, high performance electroluminescent elements can be manufactured cheaply by means of a very simple process. Consequently the invention can be applied to cheap portable-type terminals and displays use on vehicles.

What is claimed is:

1. A method for manufacturing an electroluminescent element having an anode, a cathode and a light emitting layer disposed in a plane between the anode and the cathode, wherein the method for forming the light emitting layer comprises:

forming a first layer containing a fluorescent first compound;

forming a second layer containing a second compound which absorbs a first fluorescence emitted by the first compound and which emits a second fluorescence of a longer wavelength than the first fluorescence; and allowing the second compound to permeate into the first layer to form a portion where the concentration of the second compound has a gradient along a thickness direction of the light emitting layer perpendicular to the plane, wherein the second layer is formed using an ink-jet method.

2. A method for manufacturing an electroluminescent element having an anode, a cathode and a light emitting layer disposed in a plane between the anode and the cathode, wherein the method for forming the light emitting layer comprises:

forming a first layer containing a fluorescent first compound;

forming a second layer containing a second compound which absorbs a first fluorescence emitted by the first compound and which emits a second fluorescence of a longer wavelength than the first fluorescence; and allowing the second compound to permeate into the first layer to form a portion where the concentration of the second compound has a gradient along a thickness direction of the light emitting layer perpendicular to the plane, wherein the first layer is formed using an ink-jet method.

3. A method for manufacturing an electroluminescent element having an anode, a cathode and a light emitting layer disposed between the anode and the cathode, comprising:

forming a first layer containing a first compound; and forming a second layer containing a second compound which absorbs a first light emitted by the first compound and emits a second light of a longer wavelength than the first light, the second layer formed by an ink-jet method.

4. The method of claim 3, wherein the second layer is formed after the first layer.

5. The method of claim 3, wherein the second layer is formed before the first layer.

6. The method of claim 3, wherein the first layer is formed using an ink-jet method.

7. The method of claim 3, further comprising forming a hole injection transport layer over the anode.

8. The method of claim 3, wherein the first and/or the second layer is formed into picture elements, the method further comprising forming banks between the picture elements.

* * * * *